(12) United States Patent
Suzzoni

(10) Patent No.: US 7,817,052 B2
(45) Date of Patent: Oct. 19, 2010

(54) PRINTED CIRCUIT ADAPTED TO DETECTING ACCIDENTAL HEATING

(75) Inventor: Etienne Suzzoni, Vaurial (FR)

(73) Assignee: Valeo Etudes Electroniques, Creteil (FR)

( * ) Notice: Subject to any disclaimer, the term of this patent is extended or adjusted under 35 U.S.C. 154(b) by 225 days.

(21) Appl. No.: 11/988,733

(22) PCT Filed: Jul. 12, 2006

(86) PCT No.: PCT/FR2006/001715

§ 371 (c)(1),
(2), (4) Date: May 28, 2008

(87) PCT Pub. No.: WO2007/006980

PCT Pub. Date: Jan. 18, 2007

(65) Prior Publication Data

US 2008/0265669 A1    Oct. 30, 2008

(30) Foreign Application Priority Data

Jul. 13, 2005    (FR) .................................. 05 07537

(51) Int. Cl.
G08B 21/00    (2006.01)

(52) U.S. Cl. .................. 340/635; 340/636.18; 340/584

(58) Field of Classification Search ................. 340/584, 340/586, 588, 589, 679, 635, 636.18, 643, 340/649, 693.5; 307/10.1; 361/704; 702/130, 702/132

See application file for complete search history.

(56) References Cited

U.S. PATENT DOCUMENTS

| | | | |
|---|---|---|---|
| 4,956,561 A | | 9/1990 | Tamer |
| 5,444,436 A | * | 8/1995 | Kennison ................. 340/635 |
| 6,087,949 A | * | 7/2000 | Yanagida ................. 340/635 |
| 6,337,630 B1 | * | 1/2002 | Hass et al. ............... 340/606 |
| 6,504,484 B1 | * | 1/2003 | Weng ...................... 340/584 |

FOREIGN PATENT DOCUMENTS

| | | |
|---|---|---|
| EP | 1 096 843 A1 | 5/2001 |
| FR | 2 733 099 A1 | 10/1996 |

* cited by examiner

*Primary Examiner*—Anh V La
(74) *Attorney, Agent, or Firm*—Oliff & Berridge, PLC

(57) ABSTRACT

The invention relates to a printed circuit (10) comprising a support (12) that is insulating under normal conditions of operation of the printed circuit (10). The printed circuit (1) carries at least one component (14) that is capable of accidentally causing undesirable heating of a sensitive zone (Z) of the support (12). For this purpose, the printed circuit (10) further includes a detector for detecting heating of the sensitive zone (Z). The detector comprises a device (26) that are sensitive to the increase in the conductivity of the support (12) with temperature.

13 Claims, 1 Drawing Sheet

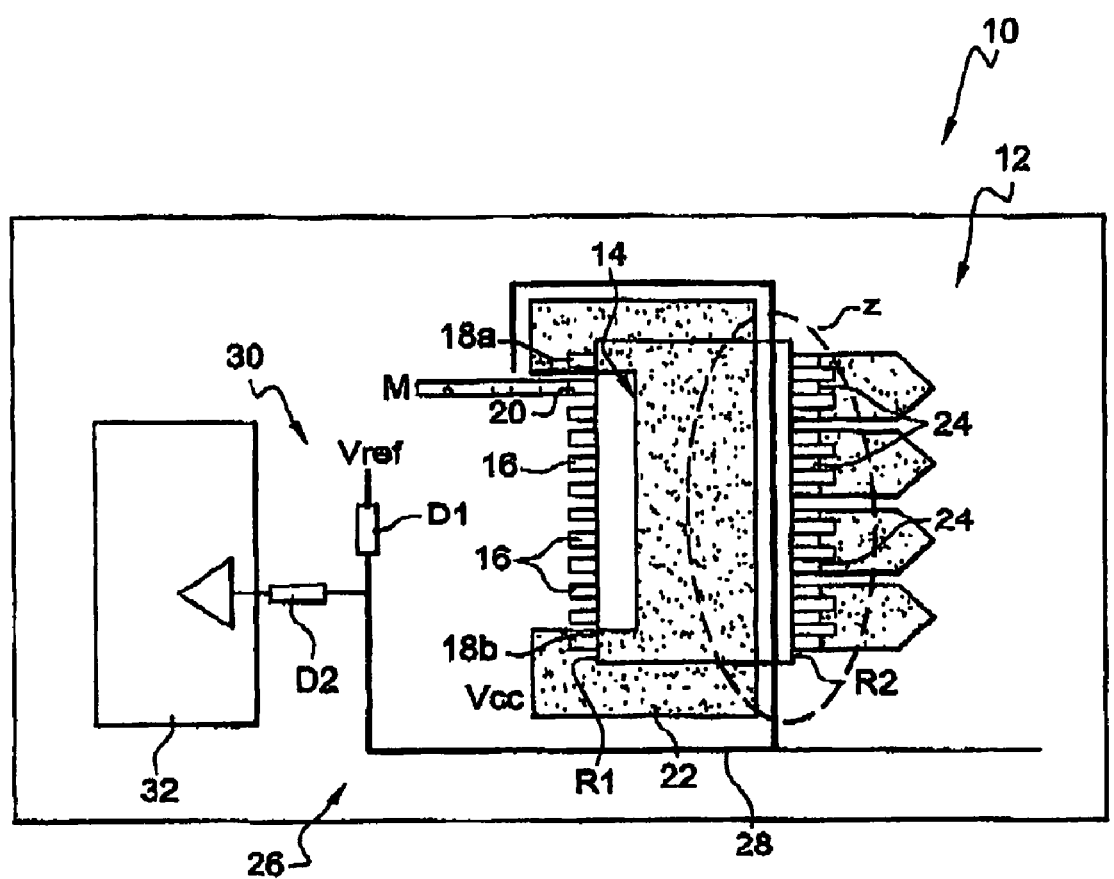
Sole figure

PRINTED CIRCUIT ADAPTED TO DETECTING ACCIDENTAL HEATING

The present invention relates to an improved printed circuit adapted to detecting accidental heating.

It is known to fit a motor vehicle with a printed circuit including at least one component of the smart power switch type.

The printed circuit comprises a support that is insulating under normal conditions of operation of the printed circuit. In general, the support is made of a material comprising epoxy resin, for example.

In conventional manner, a smart power switch has two rows of connection pins. One of these two rows comprises output pins for connection to an electrical circuit for powering electrical members of the motor vehicle.

Because the magnitudes of the currents output by the pins can be relatively high, the component is capable of causing undesirable heating of a zone of the support that is close to the row of output pins.

In particular, excessive heating of the zone of the support can start a fire.

In order to be able to prevent any risk of starting a fire, proposals have been made in the prior art for a printed circuit comprising a support that is insulating under normal conditions of operation of the circuit, which circuit carries at least one component capable of accidentally causing undesirable heating of a sensitive zone of the support, and detector means for detecting heating of the sensitive zone.

In general, the detector means comprise a temperature sensor comprising a thermistor.

In known manner, a thermistor is a temperature-sensitive component presenting resistance that varies with temperature.

Thus, by placing the thermistor on the printed circuit close to the component, it is possible, by tracking variations in the resistance of the thermistor, to detect a rise in the temperature of the component and thus of the zone of the support close to the component.

Furthermore, for considerations of effectiveness, the thermistor is preferably located at as short a distance as possible from the component.

The thermistor for detecting heating thus occupies space on the printed circuit in the environment of said component.

The space occupied on the printed circuit increases with increasing number of components to be monitored, since it is necessary to associate a thermistor with each component capable of causing undesirable heating of the support.

An object of the invention is to propose an improved circuit of the above-specified type that is adapted to detecting accidental heating and that is effective in preventing and/or detecting the start of a fire, and that does so with means that are simple and compact.

For this purpose, the invention provides a printed circuit of the above-specified type, characterized in that the detector means comprise means that are sensitive to the increase in the conductivity of the support with temperature.

Thus, the invention makes use directly of the variation in the conductivity of the support, rather than variation in the conductivity of a component (a thermistor) carried by the support.

Under normal conditions of operation of the printed circuit, the support is insulating.

In the event of accidental heating of the component, the temperature of the sensitive zone of the support close to the component increases. Above a temperature threshold that depends in particular on the material constituting the support, the support becomes conductive, in particular.

This threshold is at about 300° C. for a support based on epoxy resin.

Locally detecting a large increase in support conductivity thus serves to reveal the risk of a fire starting.

Preferably, the sensitive means comprise a first conductor element, referred to as a reference conductor element, that is taken to a reference potential under normal conditions of operation of the printed circuit, and at least one second conductor element that is taken to a potential that is different from the reference potential. The first and second elements extend at least in part in the sensitive zone.

In the event of significant heating of the sensitive zone, the first conductor element enters into electrical contact with the second conductor element.

As a result, the value of the potential of the first conductor element varies downwards or upwards depending on the value of the potential of the second conductor element.

It is then possible to detect heating of the sensitive zone of the support by monitoring the variations in the potential of the first conductor element.

For this purpose, the sensitive means comprise means for measuring the potential of the first conductor element and means for comparing the potential of the first conductor element with the reference potential.

The printed circuit of the invention may further include one or more of the following characteristics:

the second conductor element is a power supply track for the component, which track is taken to a power supply potential for the component;

the component includes a soleplate forming a power supply terminal soldered to the power supply track;

the reference conductor element extends longitudinally between a rectilinear edge of the power supply track and a row of connection pins of the component;

the sensitive means comprise means for comparing the potential of the first conductor element with the reference potential;

the reference potential is equal to half the power supply potential for the electronic component;

for the support carrying a group of components capable of accidentally causing heating in a plurality of sensitive zones, the reference first conductor element comprises a plurality of branches extending respectively in the various sensitive zones of the support;

the support is made of a material comprising epoxy resin;

the component is a smart power switch having first and second rows of connection pins, the first row comprising input pins and the second row comprising output pins, the sensitive zone extending closer to the second row than to the first row;

the second element is a conductor element forming a pin connecting the component ground or an output pin;

for the support carrying a group of components capable of accidentally causing heating of a plurality of sensitive zones, the detector means comprise means sensitive to the increase in the conductivity of the support with temperature, said means being associated respectively with the various sensitive zones of the support; and each of the means sensitive to the increase in the conductivity of the support is designed to be connected to computer means in particular for the purpose of identifying, amongst the various components carried by the printed circuit, the group of components or the components that is responsible for undesirable heating of a zone of the support.

The invention can be better understood on reading the following description given purely by way of example and made with reference to the drawing, in which the sole FIGURE is a diagram of a printed circuit of the invention.

The FIGURE shows a printed circuit of the invention, given overall reference 10.

The printed circuit 10 comprises a support 12 that is insulating under normal conditions of operation of the printed circuit 10.

In the example described, the support 12 is made of a material comprising epoxy resin. As a result, the support 12, which is insulating at normal operating temperatures of the printed circuit, becomes significantly conductive at temperatures higher than about 300° C.

The printed circuit 10 carries a component 14. In the example described, the component 14 is of the smart power switch type. In a variant, the component 14 could be a power supply terminal, a resistor, a transistor, a relay, or any other component that could lead to undesirable heating of a zone of the support 12.

In general, a component of the smart power switch type includes first and second rows R1 and R2 of connection pins.

The first row R1 comprises inlet pins 16, power supply pins 18a, 18b, and a pin 20 that is connected to ground M. By way of example, the input terminals 16 are designed to be connected to a microcomputer (not shown) for controlling the component 14.

The power supply pins 18a, 18b are interconnected electrically by a track 22 for powering the component 14, which track is taken to a power supply voltage Vcc.

In conventional manner, the component 14 has a rectangular soleplate, forming a power supply terminal and soldered to the power supply track 22.

In general, the soleplate is made of a metal material and is designed also to dissipate the heat energy that is generated during operation of the component 14.

The second row R2 comprises output terminals 24. By way of example, the terminals 24 are for connection to an electrical circuit for powering an electrical member of a motor vehicle (not shown).

In general, the component 14 generates high currents that are output via the terminals 24. Thus, the component 14 runs the risk of accidentally causing a sensitive zone Z of the support 12 to become undesirably heated. The sensitive zone Z extends closer to the second row R2 than to the first row R1.

In order to detect accidental heating in the sensitive zone Z, the printed circuit 10 includes means for detecting heating of the sensitive zone Z.

In particular, since the support 12 is made of a material that includes epoxy resin, the sensitive zone Z becomes conductive, at least locally, for temperatures greater than about 300° C.

The detector means thus comprise means 26 that are sensitive to the increase in the conductivity of the support 12 with temperature.

The sensitive means 26 comprise a first conductor element, referred to as a reference element, that is taken under normal operating conditions of the printed circuit 10 to a reference potential Vref, and at least one second conductor element that is taken to a potential that is different from the reference potential Vref.

The first and second conductor elements extend at least in part within the sensitive zone Z.

In the example described, the first conductor element is a conventional track 28 of the printed circuit 10, referred to as a reference track, and the second conductor element is the power supply track 22.

The reference track 28 preferably extends longitudinally between a rectilinear edge of the power supply track 22 and the row R2 of the component 14 that includes the pins 24 for connecting the component 14 to the electrical circuit (not shown) that is to be powered.

In the sensitive zone Z, the distance between the track 28 and the power supply track 22 is determined by the person skilled in the art as a function of the constraints associated with available space and current magnitude.

Thus, under normal operating conditions of the printed circuit 10, the tracks 28 and 22 are electrically insulated from each other. However, in the event of accidental heating of the zone Z, in particular to a temperature greater than about 300° C., the local increase in the conductivity of the support 12 establishes an electrical connection between the two tracks 28 and 22.

In a variant, the second conductor element may be a conductor element forming a junction pin 16, 20, 18a, 18b, or an output pin 24 of the component 14.

The potential of the reference track 28, which has a value equal to the reference potential Vref under normal conditions of operation of the printed circuit 10, then varies because of the appearance of the electrical junction between the two tracks 28 and 22.

The invention makes it possible to detect heating of the sensitive zone Z of the support 12 by tracking variations in the potential of the reference track 28.

For this purpose, the sensitive means 26 further comprise measurement means 30 for measuring the potential of the reference track 28. In the example described, the measurement means 30 comprise a voltage divider bridge made up of two resistive two-terminal circuits D1, D2.

The sensitive means 26 further comprise means 32 for comparing this potential with the reference potential Vref.

Thus, when the potential of the reference track 28 varies, it is possible to detect an increase in the conductivity of the zone Z, and thus to detect heating of said zone Z.

The value of the reference potential Vref is preferably half the power supply potential Vcc. Thus, in the event of an electrical connection by a local increase in the temperature and in the conductivity of the support 12 between the reference track 28 and the power supply track 22, the potential of the reference track 28 increases.

In contrast, when the heating takes place in a zone of the support that is close to the pin 20 connected to ground M, then the potential of the reference track 28 decreases.

There follows a description of the main aspects of the operation of the printed circuit 10 that are associated with the invention.

Under normal conditions of operation of the printed circuit 10, the support 12 is insulating and the reference track 28 is taken to a potential Vref.

In the event of accidental heating of the sensitive zone Z, in particular when the zone Z of the support 12 reaches a temperature greater than 300° C., the support 12 becomes conductive in the heated zone Z.

Thus, the reference track 28 is liable to become connected, by means of a local increase in the conductivity of the support 12, to the power supply track 22, to an output pin 24, or indeed to the pin 20 connected to ground M.

The potential of the reference track 28 varies as a function of the potential of the second conductor element with which the electrical junction is established.

The means 30 measure the potential of the track 28 and the means 32 compare the value of said potential with the reference potential Vref.

Thus, when a local increase in the conductivity of the support 12 causes the reference track 28 to be connected to the power supply track 22, the potential of the reference track 28 increases.

In contrast, when a local increase in the conductivity of the support 12 causes the reference track 28 to be connected to the terminal 20 connected to ground M, the potential of the reference track 28 decreases.

The invention makes it possible to detect a rise in the conductivity of the support 12 by tracking variations in the potential of the track 28.

Thus, the invention takes advantage of the property whereby the conductivity of the support 12 increases with temperature, and as a result the detector means are compact and simple.

In a variant, the support 12 can carry a plurality of components 14.

Under such circumstances, in order to monitor a group of components 14 that might accidentally cause undesirable heating of a plurality of sensitive zones Z, the detector means can comprise a plurality of means 26 that are sensitive to an increase in the conductivity of the support 12 with temperature, associated respectively with different sensitive zones Z of the support 12.

Optionally, in order to limit electronic component density on the support 12 of the printed circuit 10, and in particular the density of the sensitive means 26, the reference first conductor element 28 of each of the sensitive means 26 can have a plurality of branches extending respectively into the various sensitive zones Z.

As a result, the same sensitive means 26 can monitor a group of components 14.

Preferably, each of the sensitive means 26 is designed to be connected to computer means serving in particular to identify the group of components 14 or the component 14 that is responsible for undesirable heating of a sensitive zone Z of the support 12.

The invention claimed is:

1. A printed circuit of the type comprising a support that is insulating under normal conditions of operation of the printed circuit, the support carrying at least one component capable of accidentally causing undesirable heating of a sensitive zone of the support, and detector means for detecting heating of the sensitive zone, the circuit being characterized in that the detector means comprise means that are sensitive to the increase in the conductivity of the support with temperature.

2. A printed circuit according to claim 1, wherein the means sensitive to the increase in the conductivity of the support comprise:
   a first conductor element extending over the support, referred to as the reference conductor element, and taken under normal conditions of operation of the printed circuit to a reference potential;
   at least one second conductor element extending over the support and taken to a potential different from the reference potential, the first and second conductor elements extending at least in part in the sensitive zone; and
   means for measuring the potential of the first conductor element.

3. A printed circuit according to claim 2, wherein the second conductor element is a power supply track for the component, which track is taken to a power supply potential for the component.

4. A printed circuit according to claim 3, wherein the component includes a soleplate forming a power supply terminal soldered to the power supply track.

5. A printed circuit according to claim 3, wherein the reference conductor element extends longitudinally between a rectilinear edge of the power supply track and a row of connection pins of the component.

6. A printed circuit according to claim 2, wherein the sensitive means comprise means for comparing the potential of the first conductor element with the reference potential.

7. A printed circuit according to claim 2, wherein the reference potential is equal to half the power supply potential for the electronic component.

8. A printed circuit according to claim 2, the support carrying a group of components capable of accidentally causing heating in a plurality of sensitive zones, in which the reference first conductor element comprises a plurality of branches extending respectively in the various sensitive zones of the support.

9. A printed circuit according to claim 1, wherein the support is made of a material comprising epoxy resin.

10. A printed circuit according to claim 1, wherein the component is a smart power switch having first and second rows of connection pins, the first row comprising input pins and the second row comprising output pins, the sensitive zone extending closer to the second row than to the first row.

11. A printed circuit according to claim 1, wherein the second element is a conductor element forming a pin connecting the component ground or an output pin.

12. A printed circuit according to claim 1, the support carrying a group of components capable of accidentally causing heating of a plurality of sensitive zones, in which the detector means comprise means sensitive to the increase in the conductivity of the support with temperature, said means being associated respectively with the various sensitive zones of the support.

13. A printed circuit according to claim 8, wherein each of the means sensitive to the increase in the conductivity of the support is designed to be connected to computer means in particular for the purpose of identifying, amongst the various components carried by the printed circuit, the group of components or the components that is responsible for undesirable heating of a zone of the support.

* * * * *